(12) United States Patent
Chao

(10) Patent No.: US 9,770,081 B2
(45) Date of Patent: Sep. 26, 2017

(54) CASE FOR ELECTRONIC DEVICE

(71) Applicant: ELITEGROUP COMPUTER SYSTEMS CO.,LTD., Taipei (TW)

(72) Inventor: Shih-Shun Chao, Keelung (TW)

(73) Assignee: ELITEGROUP COMPUTER SYSTEMS CO.,LTD., Taipei (TW)

( * ) Notice: Subject to any disclaimer, the term of this patent is extended or adjusted under 35 U.S.C. 154(b) by 72 days.

(21) Appl. No.: 14/854,890

(22) Filed: Sep. 15, 2015

(65) Prior Publication Data

US 2016/0366996 A1  Dec. 22, 2016

(30) Foreign Application Priority Data

Jun. 18, 2015  (TW) .............................. 104209890 U

(51) Int. Cl.
| | |
|---|---|
| *H05K 5/00* | (2006.01) |
| *G06F 1/16* | (2006.01) |
| *A45C 11/00* | (2006.01) |
| *H05K 5/06* | (2006.01) |
| *A45C 13/00* | (2006.01) |

(52) U.S. Cl.
CPC .......... *A45C 11/00* (2013.01); *A45C 13/008* (2013.01); *G06F 1/1656* (2013.01); *H05K 5/0017* (2013.01); *H05K 5/061* (2013.01); *A45C 2011/002* (2013.01); *A45C 2011/003* (2013.01)

(58) Field of Classification Search
CPC .... H05K 5/061; H05K 5/0004; H05K 5/0017; H05K 5/06; H05K 9/0015; G06F 1/1656; G06F 2200/1633
See application file for complete search history.

(56) References Cited

U.S. PATENT DOCUMENTS

| | | | | |
|---|---|---|---|---|
| 4,298,204 A | * | 11/1981 | Jinkins ................... | F16J 15/062 220/378 |
| 4,347,947 A | * | 9/1982 | Hammes ............ | B65D 43/0218 220/319 |
| 4,418,830 A | * | 12/1983 | Dzung ................. | H04B 1/3833 220/378 |
| 5,613,237 A | * | 3/1997 | Bent ...................... | H04B 1/086 220/4.02 |
| 5,713,048 A | * | 1/1998 | Hayakawa ............. | G03B 17/08 396/25 |
| 6,532,152 B1 | * | 3/2003 | White ............... | G02F 1/133308 312/223.1 |
| 6,560,092 B2 | * | 5/2003 | Itou ....................... | G06F 1/1626 108/43 |

(Continued)

*Primary Examiner* — Adrian S Wilson
(74) *Attorney, Agent, or Firm* — Maschoff Brennan

(57) ABSTRACT

A case for an electronic device includes a first housing, a second housing, a support and a sealing ring. The first housing has a first surface and a second surface that together form an accommodation portion. The second surface is connected to the first surface, and the second surface surrounds the first surface. The second housing is disposed in the accommodation portion. The second housing has a third surface and a fourth surface connected to each other. The third surface faces the first surface, and the fourth surface faces the second surface. The support is disposed between the first surface and the third surface for keeping a distance between the first surface and the third surface. The sealing ring is squeezed between the second surface and the fourth surface, and the sealing ring seals the accommodation portion.

8 Claims, 6 Drawing Sheets

(56) References Cited

U.S. PATENT DOCUMENTS

| | | | | |
|---|---|---|---|---|
| 6,597,865 B1* | 7/2003 | Negishi | G03B 17/08 | 396/25 |
| 6,779,802 B2* | 8/2004 | Westra | A47L 9/00 | 277/628 |
| 6,822,161 B2* | 11/2004 | Komatsu | H05K 5/061 | 174/367 |
| 7,306,237 B2* | 12/2007 | Tsuji | F16J 15/106 | 277/644 |
| 7,436,653 B2* | 10/2008 | Yang | H04M 1/0202 | 361/679.01 |
| 7,926,818 B2* | 4/2011 | Isono | F16J 15/025 | 220/378 |
| 7,975,870 B2* | 7/2011 | Laule | B60K 15/077 | 220/582 |
| 8,254,098 B2* | 8/2012 | Liu | H04M 1/0249 | 174/50 |
| 2003/0111366 A1* | 6/2003 | Enners | G06F 1/1626 | 206/305 |
| 2004/0121226 A1* | 6/2004 | Kaelin | H01M 2/1044 | 429/96 |
| 2004/0188120 A1* | 9/2004 | Komatsu | H05K 5/061 | 174/17 CT |
| 2004/0195783 A1* | 10/2004 | Akagi | F16J 15/027 | 277/645 |
| 2007/0013140 A1* | 1/2007 | Kent | F16J 15/064 | 277/312 |
| 2007/0171603 A1* | 7/2007 | Yang | H04M 1/0202 | 361/679.01 |
| 2009/0009945 A1* | 1/2009 | Johnson | G06F 1/1613 | 361/679.27 |
| 2009/0215412 A1* | 8/2009 | Liu | H04M 1/0249 | 455/90.3 |
| 2010/0061044 A1* | 3/2010 | Zou | B32B 3/02 | 361/679.01 |
| 2010/0066026 A1* | 3/2010 | Garcia | H05K 5/061 | 277/316 |
| 2010/0206601 A1* | 8/2010 | Choraku | H05K 5/061 | 174/50.5 |
| 2010/0302718 A1* | 12/2010 | Shinoda | H05K 5/061 | 361/679.01 |
| 2011/0050053 A1* | 3/2011 | Deng | H04M 1/0266 | 312/223.1 |
| 2012/0118773 A1* | 5/2012 | Rayner | G06F 1/1626 | 206/320 |
| 2013/0170159 A1* | 7/2013 | Jiang | H04M 1/0249 | 361/753 |
| 2013/0214656 A1* | 8/2013 | Huang | H05K 5/061 | 312/223.1 |

* cited by examiner

CASE FOR ELECTRONIC DEVICE

CROSS-REFERENCE TO RELATED APPLICATIONS

This non-provisional application claims priority under 35 U.S.C. §119(a) on Patent Application No(s). 104209890 filed in Taiwan, R.O.C. on Jun. 18, 2015, the entire contents of which are hereby incorporated by reference.

TECHNICAL FIELD

The disclosure relates to a case for an electronic device, more particularly to a case having a sealing ring.

BACKGROUND

In recent years, with the popularity of electronic devices, people have used electronic devices for listening to music, watching video programs, playing video games and communicating with friends. When using the electronic device, a user may carelessly spill water or other liquid on the electronic device, which causes a short circuit event of an electronic component located in the electronic device. Therefore, a waterproof electronic device is needed.

SUMMARY

According to the disclosure, a case for an electronic device includes a first housing, a second housing, a support and a sealing ring. The first housing has a first surface and a second surface that together form an accommodation portion. The second surface is connected to the first surface, and the second surface surrounds the first surface. The second housing is disposed in the accommodation portion. The second housing has a third surface and a fourth surface connected to each other. The third surface faces the first surface, and the fourth surface faces the second surface. The support is disposed between the first surface and the third surface for keeping a distance between the first surface and the third surface. The sealing ring is squeezed between the second surface and the fourth surface, and the sealing ring seals the accommodation portion.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
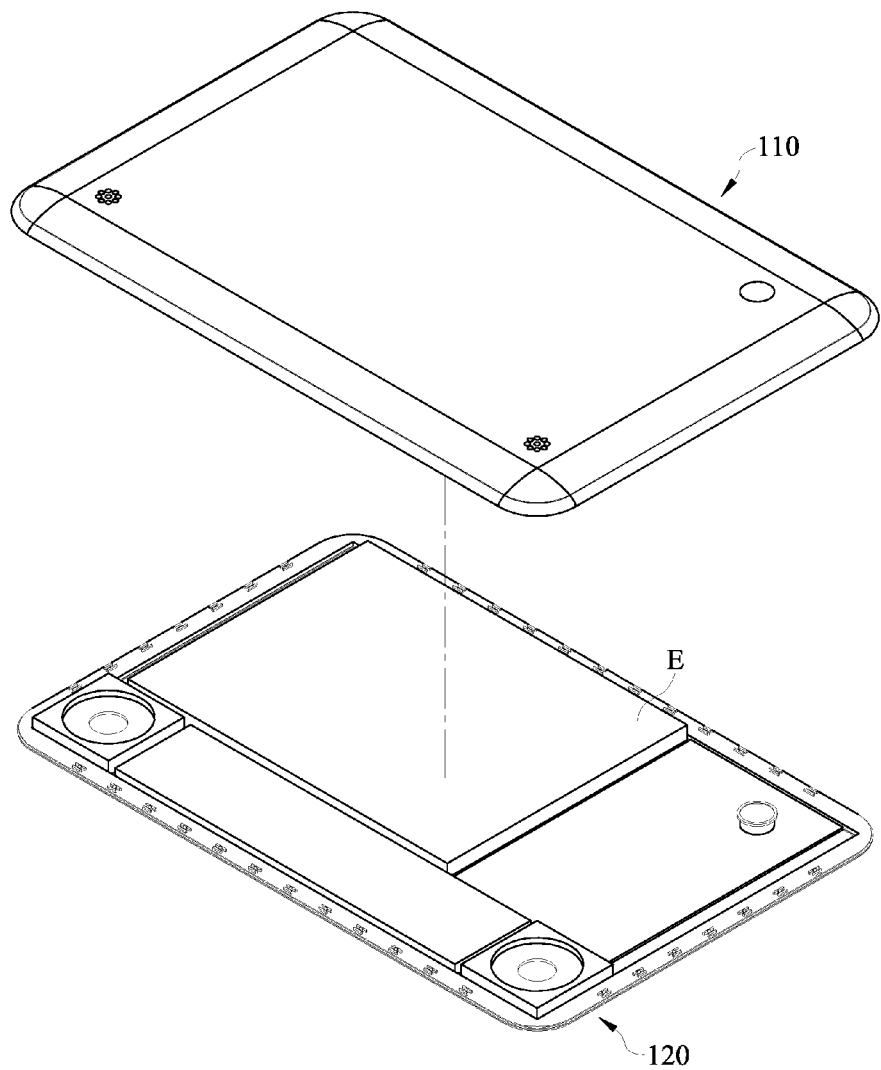
FIG. 1 is an exploded view of a case for an electronic device according to a first embodiment.
Figure 2:
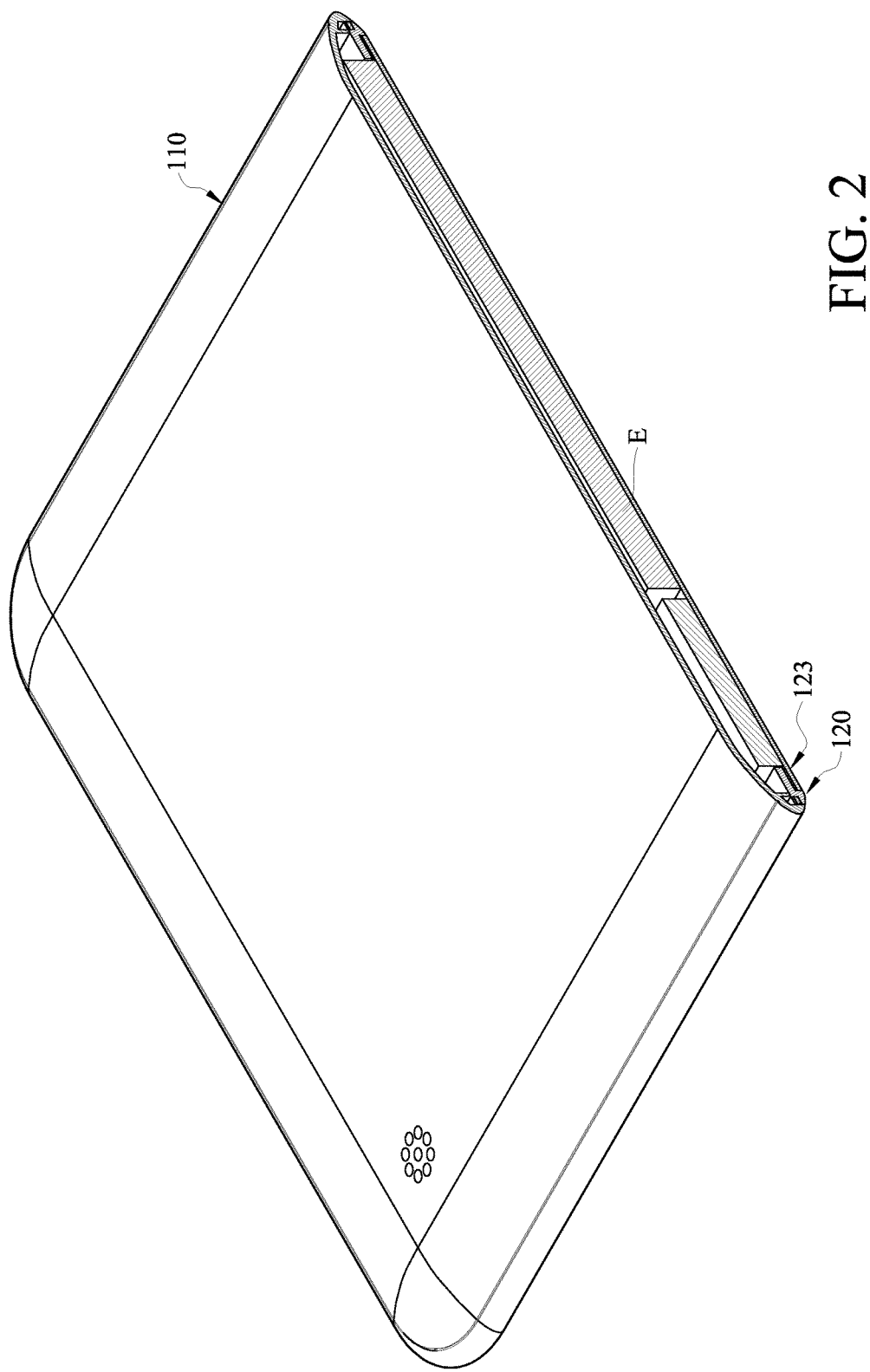
FIG. 2 is a cross-sectional view of the case in FIG. 1.
Figure 3:
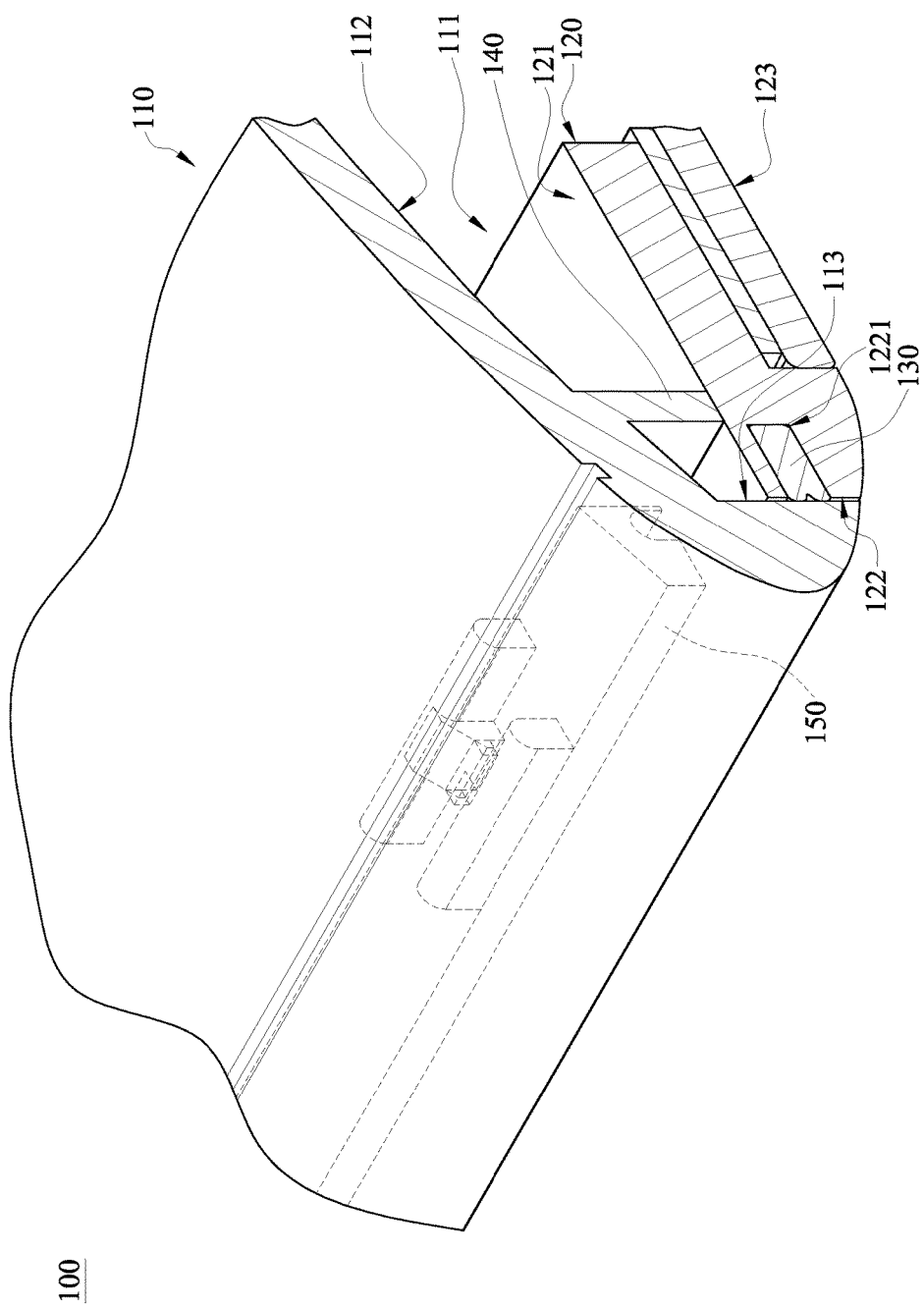
FIG. 3 is a partially enlarged view of the case in FIG. 2.
Figure 4A:
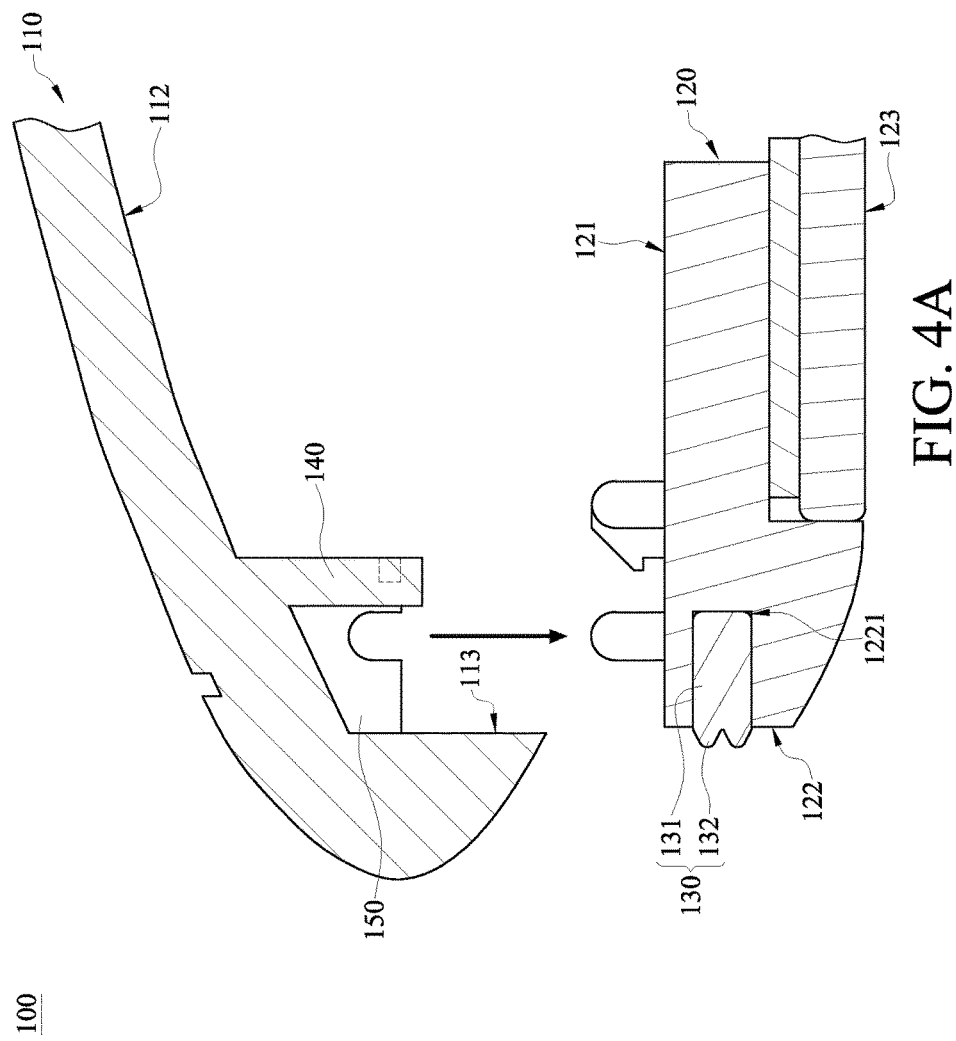
FIG. 4A is a cross-sectional view of the case in FIG. 3 with a first housing and a second housing being separated from each other.
Figure 4B:
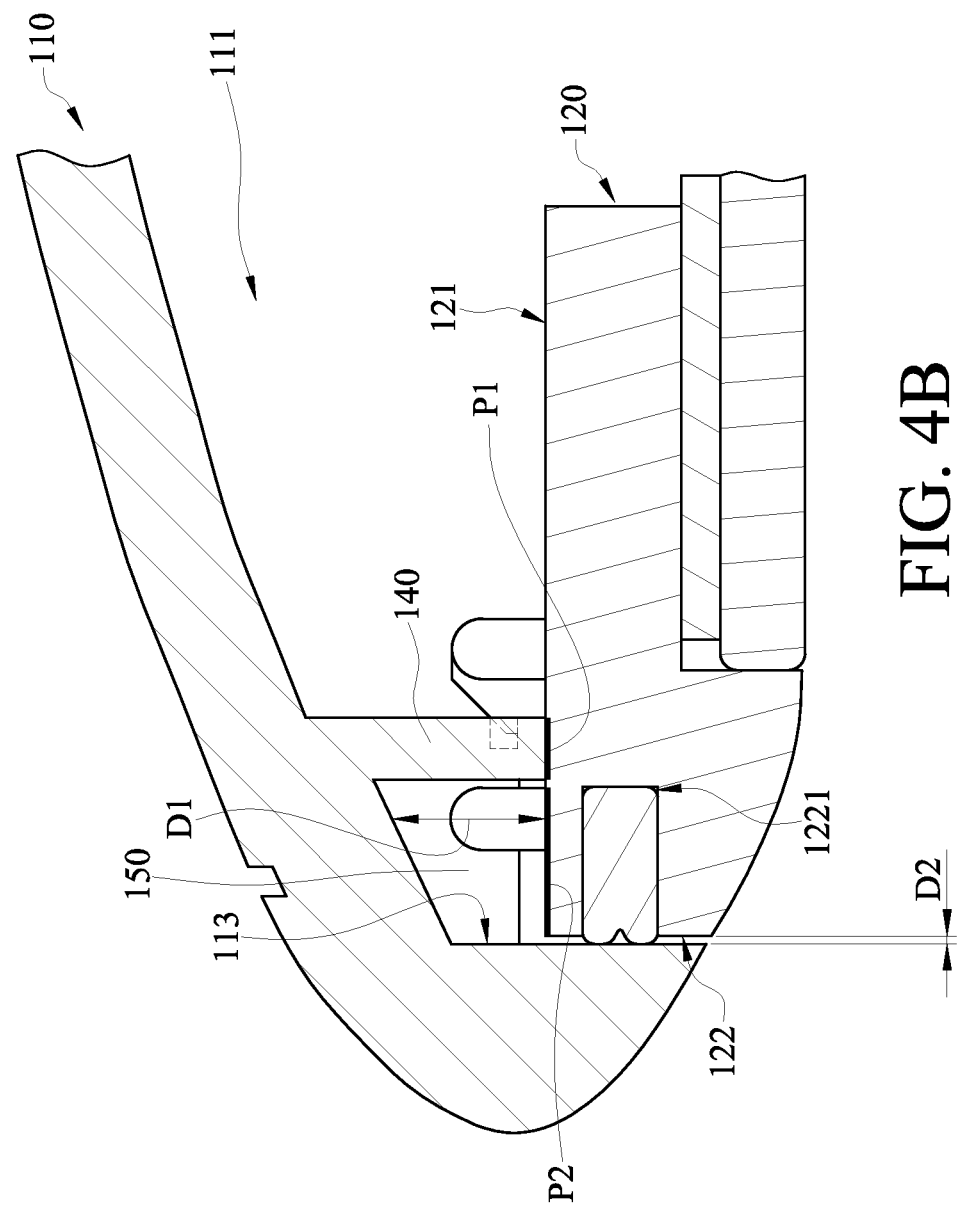
FIG. 4B is a cross-sectional view of the case in FIG. 3 with the first housing and the second housing being assembled together.

Please refer to FIG. 1 to FIG. 4B. FIG. 1 is an exploded view of a case for an electronic device according to a first embodiment. FIG. 2 is a cross-sectional view of a cross section of the case in FIG. 1. FIG. 3 is a partially enlarged view of the case in FIG. 2. FIG. 4A is a cross sectional view of the case in FIG. 3 with a first housing and a second housing being separated from each other. FIG. 4B is a cross sectional view of the case in FIG. 3 with the first housing and the second housing being assembled together.

In this embodiment, a case 100 for an electronic device includes a first housing 110, a second housing 120, a sealing ring 130, a support 140 and a reinforcement component 150. The first case 110 has an accommodation portion 111, a first surface 112 and a second surface 113. The first surface 112 and the second surface 113 form the accommodation portion 111 together. That is, the first surface 112 is a bottom surface of the accommodation portion 111, and the second surface 113 is a side wall of the accommodation portion 111. Specifically, the second surface 113 surrounds the first surface 112, and the second surface 113 is connected to the edges of the first surface 112 with an obtuse angle. The accommodation portion 111 of the first housing 110 is for accommodating and protecting an electronic component E. In this embodiment, there is an obtuse angle between the first surface 112 and the second surface 113, but the disclosure is not limited thereto. In other embodiments, there can be an acute angle or a right angle between the first surface 112 and the second surface 113. Furthermore, in this embodiment, the first surface 112 and the second surface 113 are a curved surface and a flat surface, respectively, but the disclosure is not limited thereto. In some other embodiments, both of the first surface 112 and the second surface 113 can be curved surfaces or flat surfaces.

The second housing 120 is disposed in the accommodation portion 111. The second housing 120 has a third surface 121, a fourth surface 122 and a display surface 123. The third surface 121 is connected to the fourth surface 122. The third surface 121 faces the first surface 112 of the first housing 110, and the fourth surface 122 faces the second surface 113 of the first housing 110. The second housing 120 includes a groove 1221 recessed from the fourth surface 122. The electronic component E is disposed in the accommodation portion 111 and located between the first surface 112 of the first housing 110 and the third surface 121 of the second housing 120. There is a first distance D1 between the first surface 112 and the third surface 121, and there is a second distance D2 between the second surface 113 and the fourth surface 122.

In this embodiment, the fourth surface 122 perpendicularly surrounds edges of the third surface 121, but the disclosure is not limited thereto. In other embodiments, there can be an acute angle or an obtuse angle between the third surface 121 and the fourth surface 122. Furthermore, in this embodiment, both of the third surface 121 and the fourth surface 122 are flat, but the disclosure is not limited thereto. In some other embodiments, both of the third surface 121 and the fourth surface 122 can be curved surfaces, or the third surface 121 and the fourth surface 122 can be a curved surface and a flat surface.

The display surface 123 and the third surface 121 are located at two sides of the second housing 120 that are opposite to each other, respectively. Specifically, the display surface 123 is located at the side of the second housing 120 away from the first housing 110. The display surface 123 is perpendicular to the second surface 113 of the first housing 110. In this embodiment, the display surface 123 is where a touch panel or a liquid crystal display (LCD) is located.

In FIG. 4A and FIG. 4B, the sealing ring 130 is squeezed between the second surface 113 and a bottom surface of the groove 1221 on the fourth surface 122. In detail, the sealing ring 130 includes a circular body 131 and two protrusions 132, and the two protrusions 132 are disposed on the circular body 131. The circular body 131 is disposed in the groove 1221. Each of the protrusions 132 surrounds a side surface of the circular body 131 facing the second surface 113 of the first housing 110, and the protrusions 132 are parallel to each other. A part of the sealing ring 130 is disposed in the groove 1221, and the other part of the sealing ring 130 protrudes from the fourth surface 122 and is pressed against the second surface 113. More specifically, the protrusions 132 protrude from the groove 1221, and a length of the sealing ring 130 along a normal line of the fourth surface 122 is greater than a sum of the second distance D2 and a depth of the groove 1221 so that the first housing 110, the second housing 120 and the sealing ring 130 are tightly fitted to each other. When the second housing 120 is assembled in the first housing 110, the second surface 113 and the fourth surface 122 compress the sealing ring 130 so as to deform the second surface 113, thereby the sealing ring 130 fills gaps between the second surface 113 and the fourth surface 122. Therefore, the sealing ring 130 is favorable for preventing liquid flowing into the accommodation portion 111.

In this embodiment, the size of the two protrusions 132 is the same, and the two protrusions 132 touch each other at the side surface of the circular body 131 facing the second surface 113, but the disclosure is not limited thereto. In other embodiments, the size of the two protrusions 132 can be different (for example, the two protrusions 132 can protrude from the circular body 131 with different length), and the two protrusions 132 are separated from each other at the aforementioned side surface of the circular body 131. Moreover, in this embodiment, the protrusions 132 are parallel to each other, but the disclosure is not limited thereto. In other embodiments, protruding directions of the protrusions 132 from the circular body 131 can intersect with each other.

The support 140, for example, is a rectangular rib, and the support 140 is located in the accommodation portion 111. An end of the support 140 is fixed to the first surface 112 of the first housing 110, and the other end of the support 140 abuts against the third surface 121 of the second housing 120. In detail, a height of the support 140 along a normal line of the third surface 121 is equal to the first distance D1 between the first surface 112 and the third surface 121 so that two sides of the support 140 are for supporting the first surface 112 and the third surface 121, respectively. When the first housing 110 and the second housing 120 are compressed by an external force, the support 140 prevents the first housing 110 from deformation and keeps the first distance D1 between the first surface 112 and the third surface 121 being constant so as to prevent increasing the second distance D2 between the second surface 113 and the fourth surface 122. Therefore, when the force is applied on the first housing 110 and the second housing 120, the support 140 is favorable for preventing generating a interspace between the sealing ring 130 and the first housing 110 or the sealing ring 130 and the second housing 120 caused by deformations of the first housing 110 and the second housing 120, and therefore the waterproof capability of the case 100 is improved.

In this embodiment, an extending direction of the support 140 is parallel to an extending direction of the second surface 113, but the disclosure is not limited thereto. In some embodiments, the extending direction of the support 140 can intersect with the extending direction of the second surface 113. Furthermore, the number of the support 140 is one in this embodiment, but the disclosure is not limited thereto. In other embodiments, the number of the support 140 can be plural. Moreover, the support 140 and the first housing 110 are integrally formed in this embodiment, but the disclosure is not limited thereto. In other embodiments, the support 140 and the first housing 110 can be two independent components, and the support 140 can be fixed to the first housing 110 by hooks.

In addition, in this embodiment, the height of the support 140 along the normal line of the third surface 121 is equal to the first distance D1 between the first surface 112 and the third surface 121, but the disclosure is not limited thereto. In other embodiments, the height of the support 140 can be slightly less than the first distance D1. That is, the support 140 prevents the first housing 110 from continuously deforming.

In FIG. 4B, an orthogonal projection P1 of the support 140 on the third surface 121 of the second housing 120 are not overlapped with an orthogonal projection P2 of the groove 1221 on the third surface 121. Since the strength of the second housing 120 at an area where the orthogonal projection P2 is located is weaker than the strength of the second housing 120 at an area where the orthogonal projection P1 is located, it is favorable for preventing the force applied on the first housing 110 from transmitting to the area where the orthogonal projection P2 is located, thereby effectively preventing deformation of the second housing 120 at the area where the orthogonal projection P2 is located.

The reinforcement component 150, for example, is a connecting rib, and the reinforcement component 150 is located in the accommodation portion 111. Two sides of the reinforcement component 150 that are opposite to each other are connected to the second surface 113 of the first housing 110 and the support 140, respectively. When the first housing 110 and the second housing 120 are compressed by the external force or a reaction force of the sealing ring 130 corresponding to an action force of the first housing 110 pressing the sealing ring 130, the reinforcement component 150 stops the second surface 113 from moving away from the fourth surface 122 so as to keep the second distance D2 between the second surface 113 and the fourth surface 122 constant. Therefore, the reinforcement component 150 is favorable for preventing generating an interspace between the sealing ring 130 and the first housing 110 or the sealing ring 130 and the second housing 120 caused by increase of the second distance D2, and therefore the waterproof capability of the case 100 is improved.

In this embodiment, there is a distance between the reinforcement component 150 and the third surface 121, but the disclosure is not limited thereto. In other embodiments, the reinforcement component 150 can abut against the third surface 121, and therefore a generation of the interspace between the sealing ring 130 and the first housing 110 or the second housing 120 which is caused by deformations of the first housing 110 and the second housing 120 is reduced. Furthermore, the first housing 110, the support 140 and the reinforcement component 150 are integrally formed in this embodiment, but the disclosure is not limited thereto. In other embodiments, the first housing 110, the support 140 and the reinforcement component 150 can be independent components, and the first housing 110, the support 140 and the reinforcement component 150 can be fastened to each other by hooks.

Moreover, the first housing 110, for example, is assembled to the second housing 120 by a hook and a slot corresponding to each other. Therefore, the electronic component E is securely disposed in the accommodation portion 111.

Figure 5:
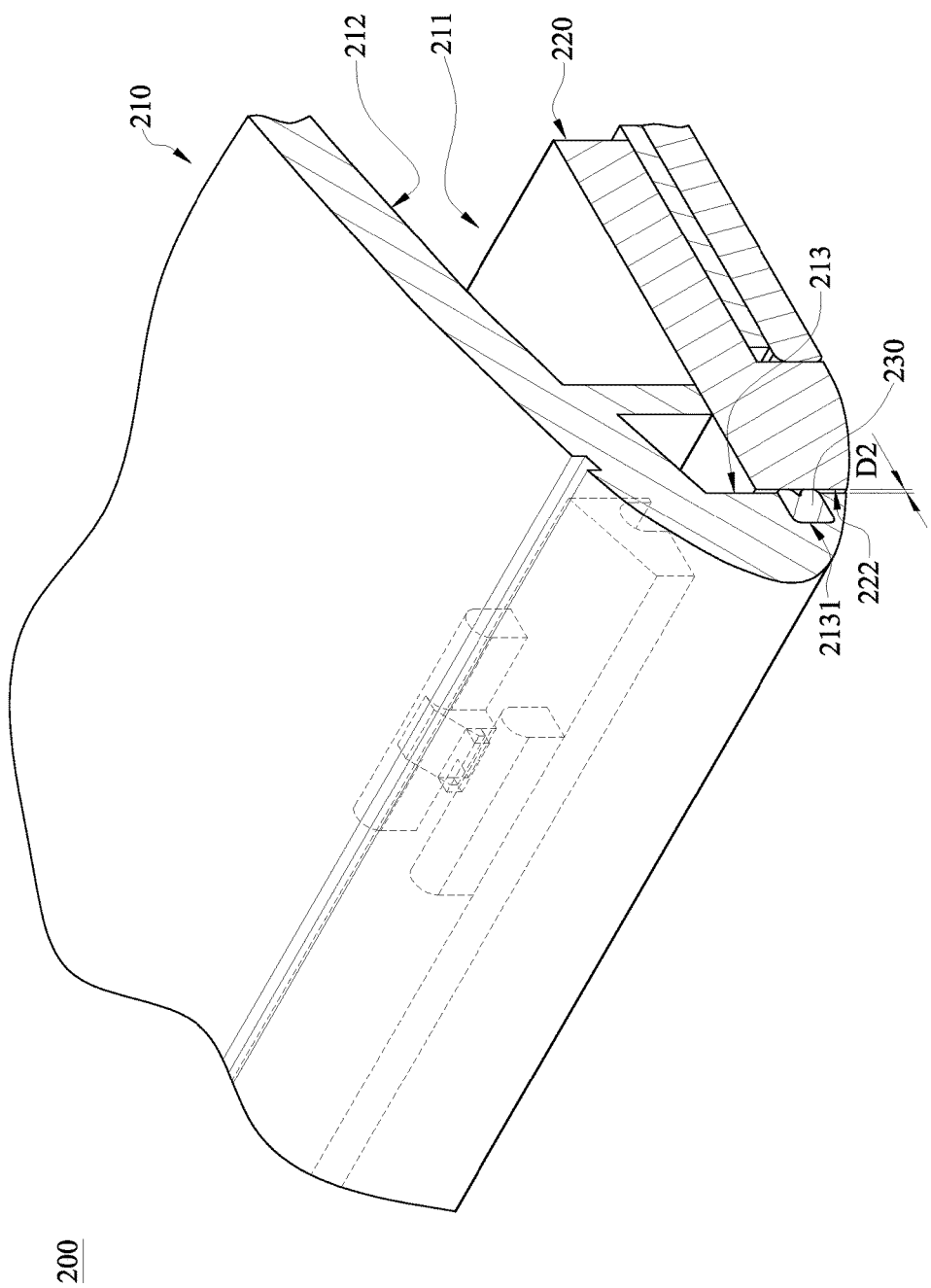
FIG. 5 is a partially cross-sectional view of a case according to a second embodiment.

The sealing ring can be disposed in a groove formed on the first housing. Please refer to FIG. 5. FIG. 5 is a partially cross-sectional view of a case according to a second embodiment. Since the second embodiment is similar to the first embodiment, only the differences will be illustrated hereafter.

In this embodiment, a first housing 210 of a case 200 for an electronic device has an accommodation portion 211, a first surface 212 and a second surface 213. The first surface 212 and the second surface 213 are for forming the accommodation portion 211 together. That is, the first surface 212 is a bottom surface of the accommodation portion 211, and the second surface 213 is a side wall of the accommodation portion 211. The first housing 210 includes a groove 2131 recessing from the second surface 213. The groove 2131 is communicated with the accommodation portion 211. A sealing ring 230 is squeezed between a fourth surface 222 of a second housing 220 and a bottom surface of the groove 2131 on the second surface 213, and the sealing ring 230 presses against the fourth surface 222. A length of the sealing ring 230 along a normal line of the second surface 213 is greater than a sum of a second distance D2 between the second surface 213 and the fourth surface 222 as well as a depth of the groove 2131 so that the first housing 210, the second housing 220 and the sealing ring 230 are tightly fitted to each other. In detail, the second surface 213 and the fourth surface 222 compress the sealing ring 230 together so as to deform the sealing ring 230, thereby the sealing ring 230 fills gaps between the second surface 213 and the fourth surface 222. Therefore, the sealing ring 230 is favorable for preventing liquid flowing into the accommodation portion 211.

According to the disclosure, the sealing ring is squeezed between the second surface and the fourth surface, and the sealing ring seals the accommodation portion. The second surface and the fourth surface together compress the sealing ring so as to deform the sealing ring, thereby the sealing ring fills gaps between the second surface and the fourth surface and avoids the liquid flowing into the accommodation portion. Therefore, it is unnecessary to compress the sealing ring by screwing two housings together which prevents the screw influencing the appearance of the case and reduces the manufacturing cost.

Furthermore, the support is for keeping the distance between the first surface and the third surface when the force is applied on the first housing. Therefore, the support is favorable for avoiding generating the interspace between the sealing ring and the first housing or the sealing ring and the second housing so as to improve the waterproof capability of the case.

Moreover, when the force pushes the first housing, the reinforcement component stops the second surface moving away from the fourth surface so as to avoid increasing the second distance between the second surface and the fourth surface. Therefore, the reinforcement component is favorable for avoiding generating the interspace between the sealing ring and the first housing or the sealing ring and the second housing so as to further improve the waterproof capability of the case.

What is claimed is:

1. A case for an electronic device, comprising:
   a first housing having a first surface and a second surface that together form an accommodation portion, the second surface connected to the first surface, and the second surface surrounding the first surface;
   a second housing disposed in the accommodation portion, the second housing having a third surface and a fourth surface that are connected to each other, the third surface facing the first surface, and the fourth surface facing the second surface;
   a support disposed between the first surface and the third surface for keeping a distance between the first surface and the third surface, the support and the first housing being integrally formed;
   a sealing ring squeezed between the second surface and the fourth surface, and the sealing ring sealing the accommodation portion; and
   a reinforcement component, two sides of the reinforcement component that are opposite to each other being connected to the second surface of the first housing and the support, respectively.

2. The case according to claim 1, wherein the second surface of the first housing comprises a groove, a part of the sealing ring is disposed in the groove, and the other part of the sealing ring is protruded from the second surface and is pressed against the fourth surface of the second housing.

3. The case according to claim 1, wherein the fourth surface of the second housing comprises a groove, a part of the sealing ring is disposed in the groove, and the other part of the sealing ring is protruded from the fourth surface and is pressed against the second surface of the first housing.

4. The case according to claim 3, wherein an orthogonal projection of the groove on the third surface of the second housing and an orthogonal projection of the support on the third surface are not overlapped with each other.

5. The case according to claim 3, wherein the sealing ring comprises a circular body and a plurality of protrusions disposed on the circular body, the plurality of protrusions surrounds a side surface of the circular body facing the second surface of the first housing and are parallel to each other; the circular body is disposed in the groove, the plurality of protrusions protrudes from the groove and is compressed by the second surface of the first housing.

6. The case according to claim 1, wherein the support and the second housing are integrally formed.

7. The case according to claim 1 wherein the reinforcement component abuts against the third surface of the second housing.

8. The case according to claim 1, wherein the second housing further has a display surface, the third surface and the display surface are opposite to each other, and the display surface is perpendicular to the second surface of the first housing.

* * * * *